United States Patent
Krivokapic et al.

(10) Patent No.: US 6,842,048 B2
(45) Date of Patent: Jan. 11, 2005

(54) TWO TRANSISTOR NOR DEVICE

(75) Inventors: Zoran Krivokapic, Santa Clara, CA (US); Judy Xilin An, San Jose, CA (US); Ming-Ren Lin, Cupertino, CA (US); Haihong Wang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 92 days.

(21) Appl. No.: 10/301,617

(22) Filed: Nov. 22, 2002

(65) Prior Publication Data

US 2004/0100306 A1 May 27, 2004

(51) Int. Cl.$^7$ .............................................. H03K 19/20
(52) U.S. Cl. ..................................... 326/112; 326/113
(58) Field of Search .......................... 326/112–114, 119, 326/121–122, 52, 54–55

(56) References Cited

U.S. PATENT DOCUMENTS

| | | | |
|---|---|---|---|
| 5,612,563 A | 3/1997 | Fitch et al. | 257/329 |
| 6,396,108 B1 | 5/2002 | Krivokapic et al. | 257/365 |
| 6,433,609 B1 * | 8/2002 | Voldman | 327/313 |
| 6,462,585 B1 * | 10/2002 | Bernstein et al. | 327/55 |
| 6,580,293 B1 * | 6/2003 | Bernstein et al. | 326/95 |
| 6,583,440 B2 * | 6/2003 | Yasukawa | 257/59 |
| 2002/0113270 A1 | 8/2002 | Bernstein et al. | |

OTHER PUBLICATIONS

Digh Hisamoto et al.: "FinFET—A Self–Aligned Double--Gate MOSFET Scalable to 20 nm," IEEE Transactions on Electron Devices, vol. 47, No. 12, Dec. 2000, pp. 2320–2325.

Yang–Kyu Choi et al.: "Sub–20nm CMOS Fin FET Technologies," 0–7803–5410–9/99 IEEE, Mar. 2001, 4 pages.

Xuejue Huang et al.: "Sub–50 nm P–Channel Fin FET," IEEE Transactions on Electron Devices, vol. 48, No. 5, May 2001, pp. 880–886.

Yang–Kyu Choi et al.: "Nanoscale CMOS Spacer FinFET for the Terabit Era," IEEE Electron Device Letters, vol. 23, No. 1, Jan. 2002, pp. 25–27.

Xuejue Huang et al.: "Sub 50–nm FinFET: PMOS," 0–7803–7050–3/01 IEEE, Sep. 1999 4 pages.

Patent Abstracts of Japan, vol. 2000, No. 15, Apr. 6, 2001 & JP 2000 340795 A (Sony Corp.), Dec. 8, 2000.

Patent Abstracts of Japan, vol. 018, No. 684, Dec. 22, 1994 & JP 06 275826 A (Fujitsu Ltd.), Sep. 30, 1994.

Patent Abstracts of Japan, vol. 018, No. 461, Aug. 26, 1994 & JP 06 151738 A (Nippon Steel Corp.), May 31, 1994.

Tetsu Tanaka et al.: Ultrafast Operation of $V_{TH}$–Adjusted p$^+$–n$^+$ Double–Gate SOI MOSFET's, *IEEE Electron Device Letters*, vol. 15, No. 10, Oct. 1, 1994, pp. 386–388.

* cited by examiner

*Primary Examiner*—James H. Cho
(74) *Attorney, Agent, or Firm*—Harrity & Snyder LLP (57) ABSTRACT

A NOR gate includes is constructed with two asymmetric FinFET type transistors instead of the conventional four-transistor NOR gate. The reduction in the number of transistors from four down to two allows for significant improvements in integrated semiconductor circuits.

13 Claims, 7 Drawing Sheets

TWO TRANSISTOR NOR DEVICE

BACKGROUND OF THE INVENTION

A. Field of the Invention

The present invention relates generally to semiconductor manufacturing and semiconductor devices and, more particularly, to double gate metal-oxide semiconductor field-effect transistors (MOSFET).

B. Description of Related Art

Transistors, such as MOSFETs, are the core building block of the vast majority of semiconductor devices. Some semiconductor devices, such as high performance processors, can include millions of transistors. For these devices, decreasing transistor size, and thus increasing transistor density, has traditionally been a high priority in the semiconductor manufacturing area.

Conventional MOSFETs have difficulty scaling below 50 nm fabrication processing. To develop sub-50 nm MOSFETs, double-gate MOSFETs have been proposed. In several respects, the double-gate MOSFETs offer better characteristics than the conventional bulk silicon MOSFETs. These improvements arise because the double-gate MOSFET has a gate electrode on both sides of the channel, rather than only on one side as in conventional MOSFETs. When there are two gates, the electric field generated by the drain is better screened from the source end of the channel. Also, two gates can control roughly twice as much current as a single gate, resulting in a stronger switching signal.

Transistors on a semiconductor device are often connected into groups that implement higher level logical gates. One frequently used logical gate is the NOR gate. Conventionally, four transistors, such as four double-gate MOSFETs, are used to create a NOR gate.

It would be desirable to more efficiently implement a logical gate such as a NOR gate, as this would increase the overall efficiency of the semiconductor device.

SUMMARY OF THE INVENTION

Implementations consistent with the present invention include a NOR gate implemented with only two transistors.

One aspect of the invention is directed to an integrated semiconductor device. The device includes a number of asymmetric FinFETs, at least some of the FinFETs being arranged as pairs of FinFETs that define logic NOR gates.

A second aspect of the invention is directed to a logic NOR gate consisting of a first double-gate transistor and a second double-gate transistor. An output signal coupled to the first and second transistors reflects a logical NOR operation of two input signals coupled to the first and second transistors.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawing. The same reference numbers may be used in different drawings to identify the same or similar elements. Also, the following detailed description does not limit the invention. Instead, the scope of the invention is defined by the appended claims and equivalents.

Two transistors are connected together to implement a NOR gate. Each one of the transistors may be an asymmetric FinFET having two separately addressable gates.

Asymmetric FinFET

A FinFET, as the term is used herein, refers to a type of double-gate MOSFET in which a conducting channel is formed in a vertical Si "fin" controlled by a self-aligned double-gate. FinFETs are known in the art. Although conventional FinFETs are typically described as "double-gate" MOSFETs, the two gates are electrically connected and thus form a single logically addressable gate.

Figure 1:
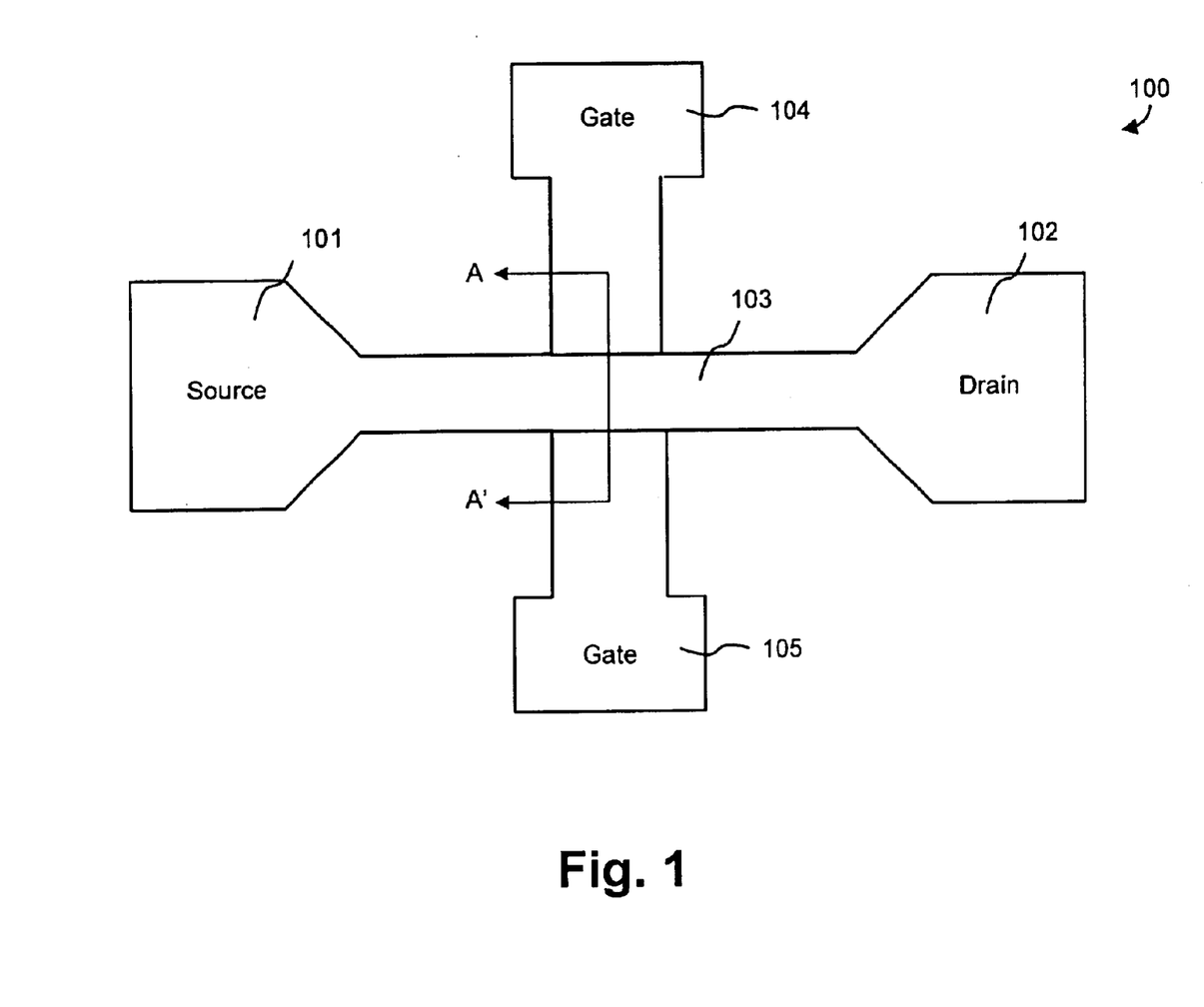
FIG. 1 is a schematic diagram that illustrates a top-level view of a FinFET consistent with principles of the invention.

FIG. 1 is a top-level view of a FinFET 100 consistent with principles of the invention. FinFET 100 includes a source region 101, a drain region 102, and a channel region 103. The channel region 103 includes the transistor's fin, as described with respect to FIG. 2, below. Unlike conventional FinFETs, in which both sides of the gate are electrically connected together, FinFET 100 may additionally include two addressable gates, labeled as gates 104 and 105. The gates may further be asymmetrically doped. Gate 104 may, for example, be implanted with n-type dopants (e.g., $As^+$ or $P^+$) and gate 105 may be implanted with p-type dopants (e.g., B or $BF_2$), as described in more detail below.

FIGS. 2–7 are cross-sectional views taken along the line A-A' in FIG. 1. FIGS. 2–8 each illustrate steps in the manufacturing process of FinFET 100.

Figure 2:
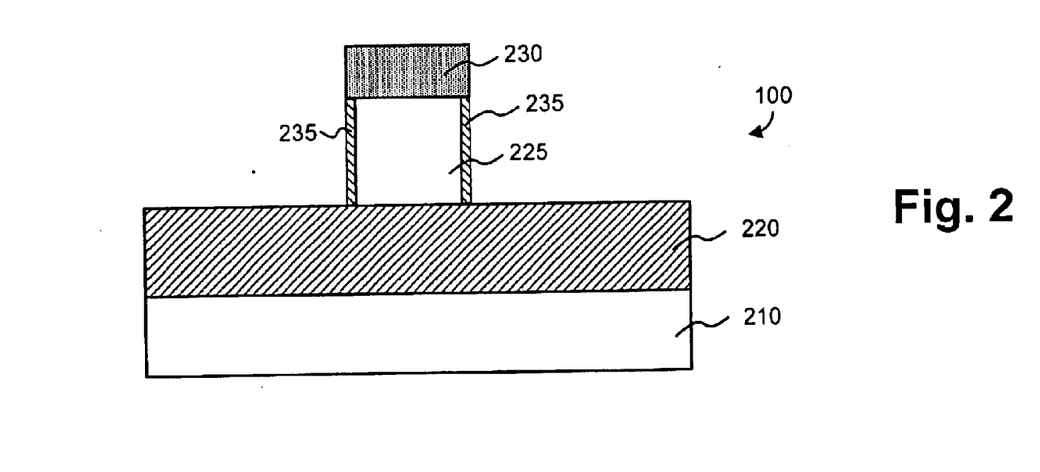
FIGS. 2–7 are schematic diagrams taken along the line A-A' in FIG. 1 that illustrate a method of forming an asymmetric FinFET.

Referring to FIG. 2, FinFET 100 may be a silicon on insulator (SOI) device that includes a silicon substrate 210 and a buried oxide (BOX) layer 220 disposed on the silicon substrate. Substrate 210 and layer 230 may alternatively comprise germanium, metals, or combinations of such materials, such as silicon-germanium. Buried oxide layer 220 may be formed on silicon substrate 210 in a conventional manner. Buried oxide layer 220 may range, for example, from approximately 200 nm to 400 nm in thickness.

A silicon layer may be disposed on BOX layer 220 and etched to create the source, drain, and fin 225 (source and drain not shown in FIG. 2). Alternatively, source/drain regions 101 and 102 may be formed by depositing silicon and etching the silicon after the fin 225 is formed. In one implementation, fin 225 may range from, for example, approximately 5 nm to about 25 nm in width. Before etching fin 225, a $Si_3N_4$ layer 230 may be deposited via chemical vapor deposition (CVD) on fin 225. Layer 230 may alternatively be a $SiO_2$ layer. Layer 230 protects fin 225 during the fabrication process, and may be, for example, deposited to a thickness ranging from about 20–50 nm.

By oxidizing the silicon surface of fin 225, gate dielectric layers 235 may be grown on the side surface of fin 225. Gate dielectric layers 235 may be as thin as 0.8 nm to 2 nm in width.

Figure 3:
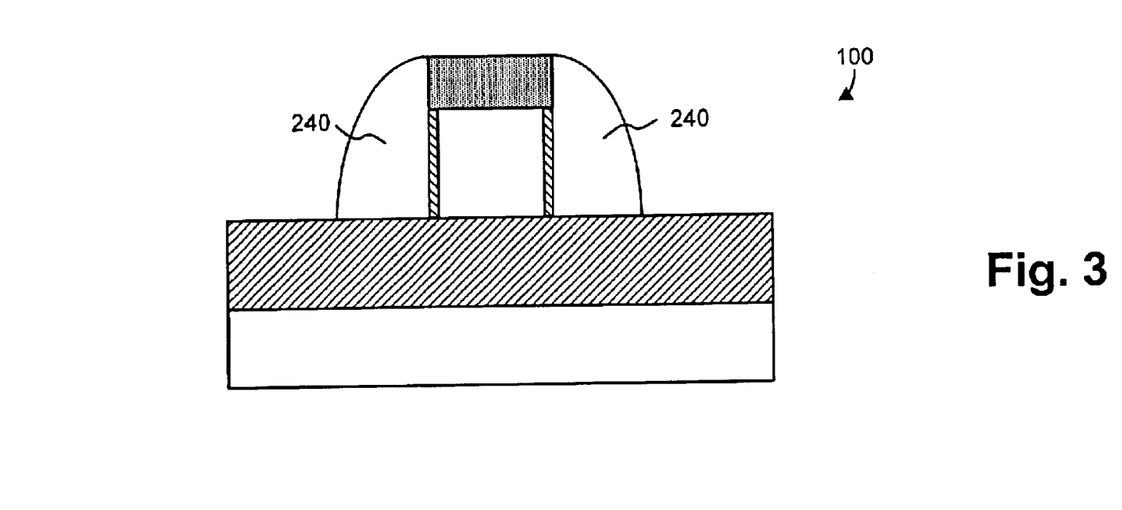

Referring to FIG. 3, polysilicon spacers 240 may next be formed around fin 225 (and around gate dielectric layers 235 and layer 230) using conventional deposition and etching techniques.

Figure 4:
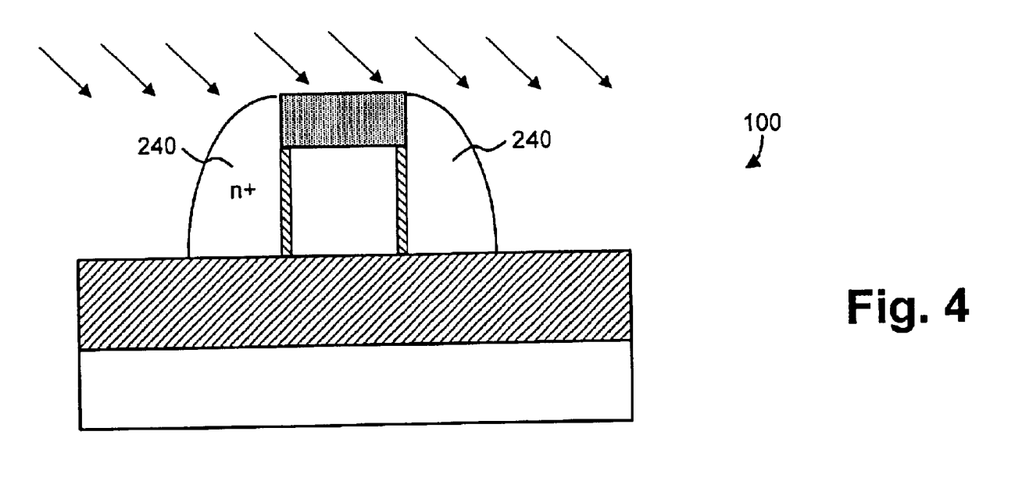
Figure 5:
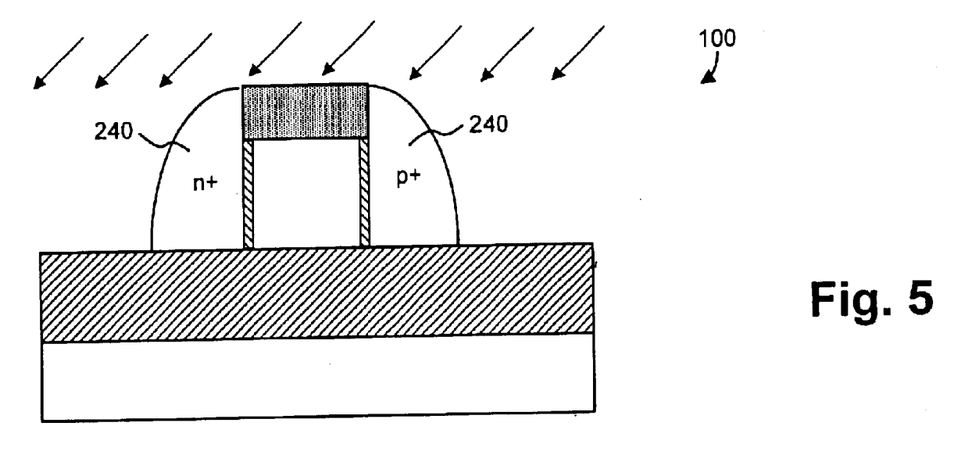

Polysilicon spacers 240 may then be implanted with an n-type dopant using a tilted implant process (FIG. 4). The dopant may be, for example, As⁺ or P⁺, and may be implanted using a 3–6 keV (for P⁺) or 12–15 keV (for As⁺) ion beam at a tilt angle of between 15 and 45 degrees. Because of the presence of fin structure 225, including gate dielectric layers 235 and layer 230, the n-type dopant will be largely blocked from entering one side of polysilicon spacers 240 (e.g., as illustrated of the right side of FIG. 4).

Following the n-type dopant implantation, polysilicon spacers may be implanted with a p-type dopant using a tilted implant process. The ion beam of the implant process may be tilted at a complimentary angle to that described with respect to FIG. 4. The dopant may be, for example, B or $BF_2$, and may be implanted using a 1–2 keV (for B) or 4–8 keV (for $BF_2$) ion beam at a tilt angle of between 15 and 45 degrees. Because of the presence of fin structure 225, including gate dielectric layers 235 and layer 230, the p-type dopant will be largely blocked from entering one side of polysilicon spacers 240 (e.g., as illustrated on the left side in FIG. 5). Accordingly, the two polysilicon spacers 240 will be asymmetrically doped with n-type and p-type dopants. One of ordinary skill in the art will appreciate that the order of the steps shown in FIGS. 4 and 5 could be readily reversed.

Figure 6:
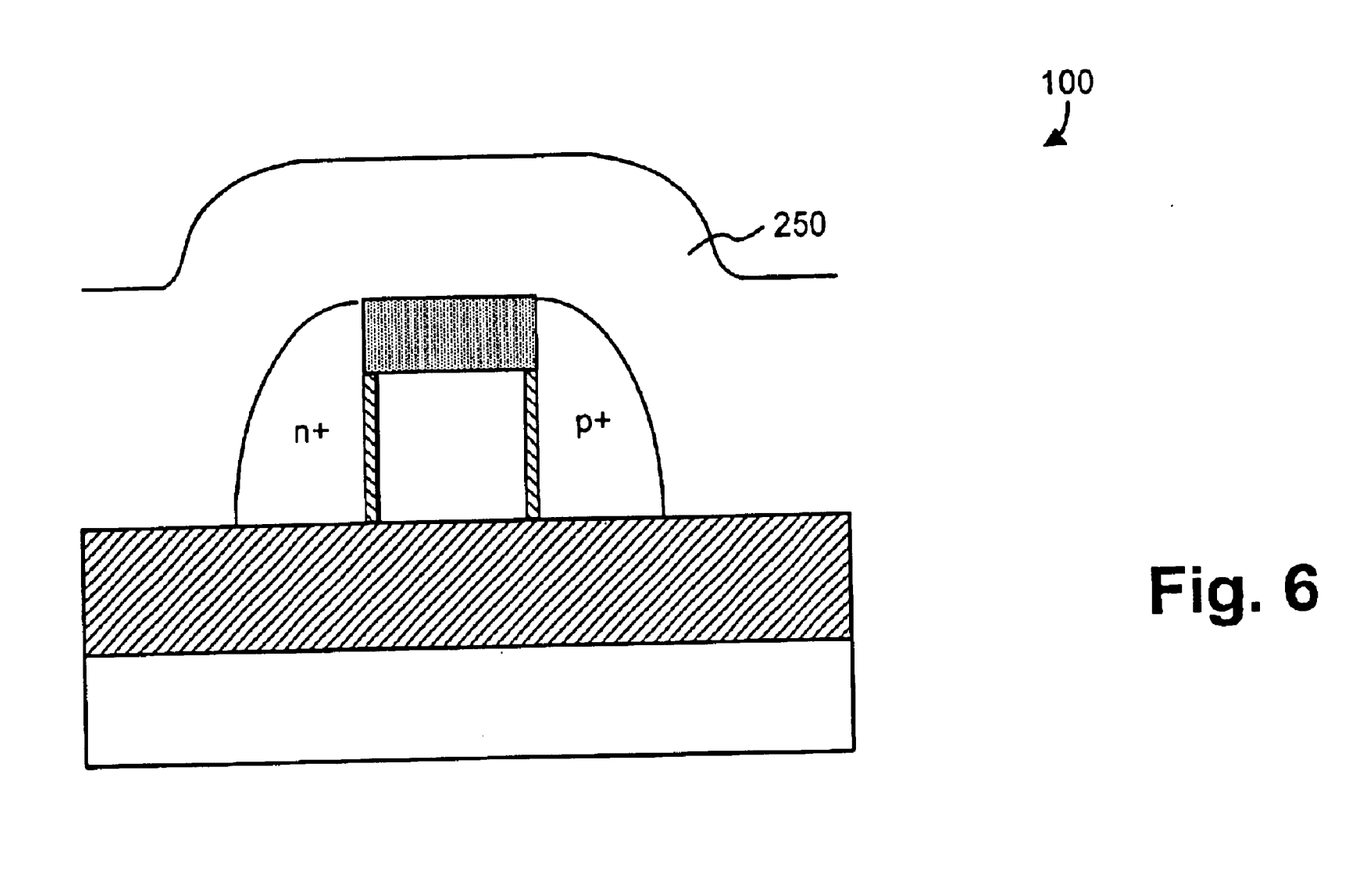

Referring to FIG. 6, an undoped polysilicon layer 250 may then be deposited on FinFET 100. Polysilicon layer 250 will form the gates of FinFET 100. Layer 250 may be deposited via, for example, CVD to a depth of approximately 100 nm.

Figure 7A:
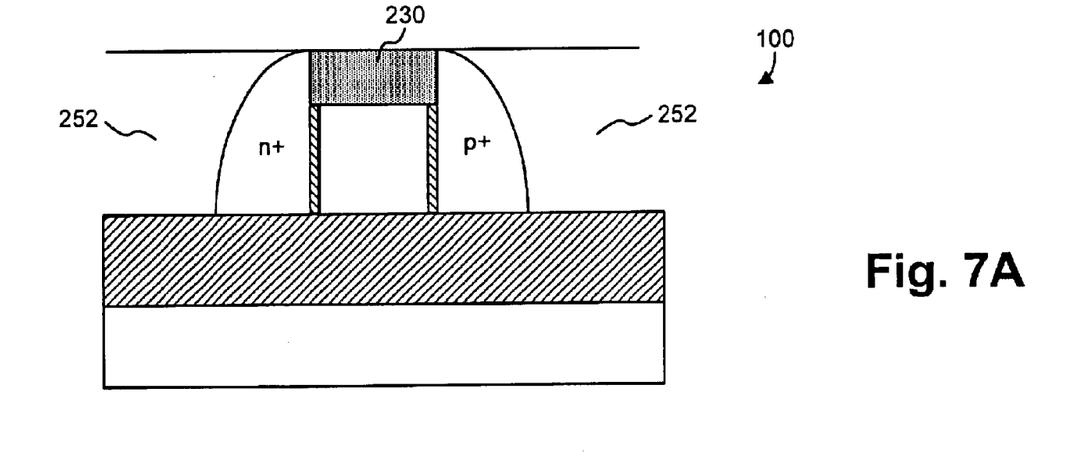
Figure 7B:
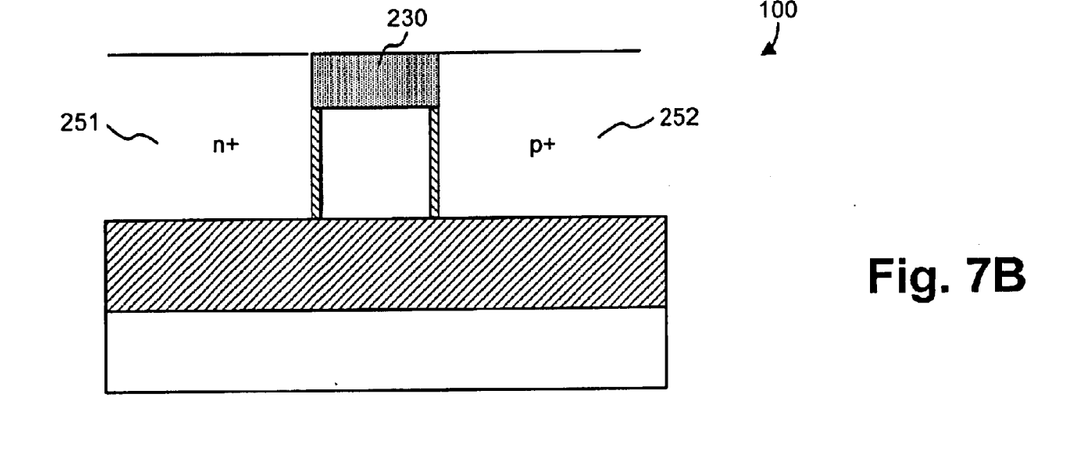

After depositing the polysilicon layer 250, FinFET 100 may be planarized such that layer 250 is substantially planar with the top surface of layer 230, as illustrated in FIG. 7A. This yields two electrically unconnected polysilicon layers, labeled as layers 251 and 252. FinFET 100 may then be annealed to create fully-silicided polysilicon layers 251 and 252, as illustrated in FIG. 7B. Layers 251 and 252 may be connected to gate pads 104 and 105 and may be independently controlled.

Other processes for creating asymmetric FinFETs, such as those illustrated in FIG. 7B may alternatively be employed. For example, the tilt implant process described with respect to FIGS. 4 and 5 may be performed after polysilicon gate material is deposited and planarized. In each case, the resulting structure includes the two separately controllable gates, as illustrated in FIG. 7B.

NOR Gate

A NOR gate is a logic gate that is frequently used in integrated circuits. A NOR gate outputs a value based on two or more input signals. Conventionally, NOR gates are constructed using four transistors.

The logic for a two-input NOR gate is shown below in Table I.

TABLE I

| Input A | Input B | Output |
|---------|---------|--------|
| 0 | 0 | 1 |
| 0 | 1 | 0 |
| 1 | 0 | 0 |
| 1 | 1 | 0 |

Figure 8:
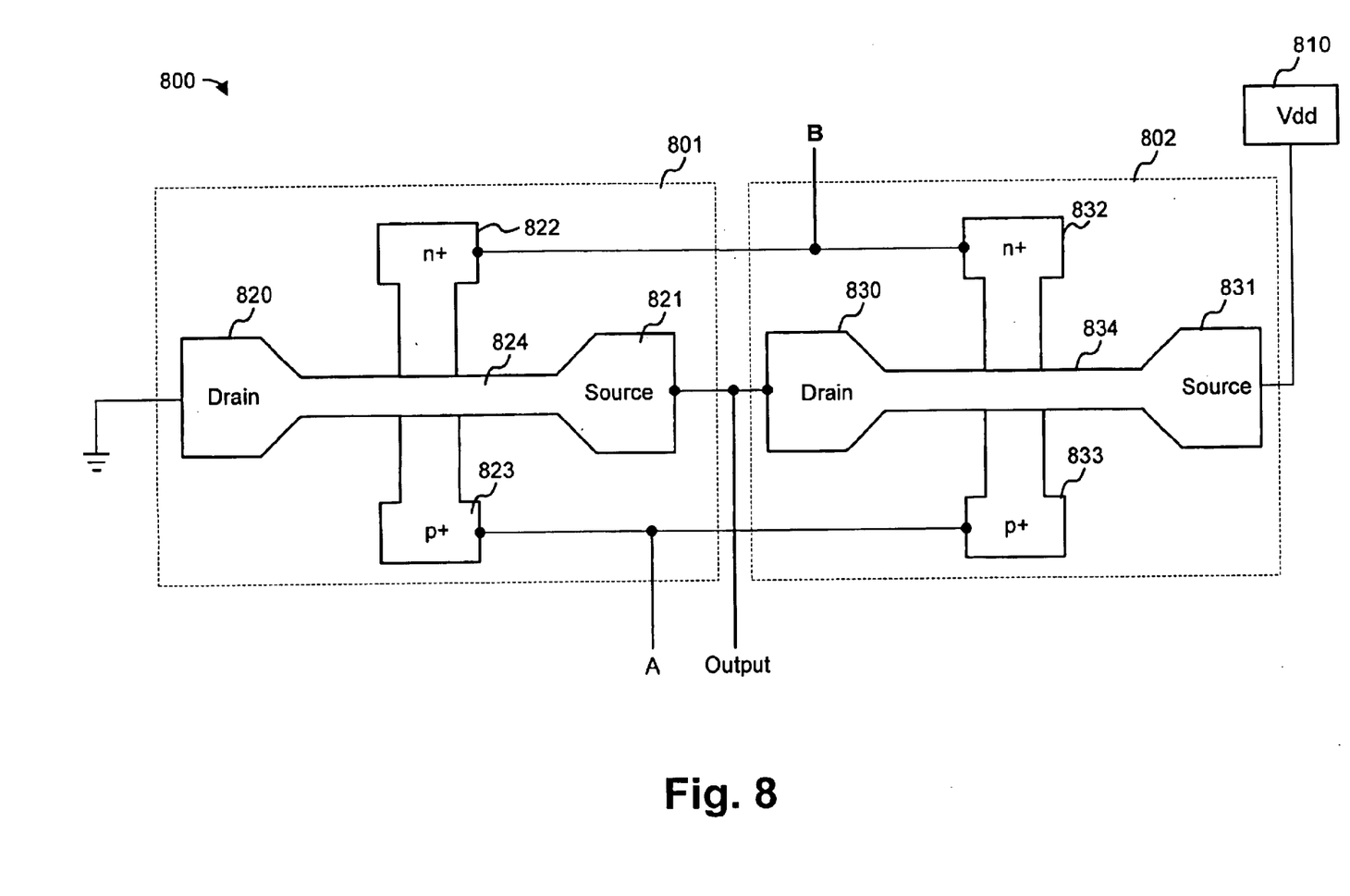
FIG. 8 is a schematic diagram that illustrates a top view of a NOR gate constructed in a manner consistent with the present invention.

Consistent with an aspect of the invention, a NOR gate is constructed using two asymmetric FinFETs, such as FinFETs 100. FIG. 8 is a top view of NOR gate 800 constructed in a manner consistent with the present invention. NOR gate 800 may be located in an integrated semiconductor device.

NOR gate 800 includes two FinFETs, labeled as FinFETs 801 and 802. Each of FinFETs 801 and 802 are similar to FinFET 100. In particular, FinFET 801 includes a drain region 820, a source region 821, a first gate 822, a second gate 823, and a channel (fin) region 824. FinFET 802 similarly includes a drain region 830, a source region 831, a first gate 832, a second gate 833, and a channel region 834. First gates 822 and 832 may be doped with n-type impurities while second gates 823 and 833 may be doped with p-type impurities.

As shown in FIG. 8, gates 822 and 832 may be electrically connected; gates 823 and 833 may be electrically connected; and source 821 may be electrically connected to drain 830. Drain 820 may be connected to ground, and source 831 may be connected to a power supply 810.

In operation, the input signal lines to NOR gate 800 (labeled as inputs "A" and "B" in FIG. 8) are applied to the first and second pairs of electrically connected gates. Thus, input signal line A may connect to gates 823 and 833, while input signal line B may connect to gates 822 and 832. The output signal of NOR gate 800 is taken between source 821 and drain 830. The output value depends on inputs A and B according to the logic shown in Table I.

Additional Disclosure

In certain situations, it may be desirable to create integrated circuits that include both conventional FinFETs, which have a single connected double-gate, and the asymmetric FinFET described above, which has two separately addressable gates. In these situations, all of the FinFETs may be initially created as described above in FIGS. 2–7. An additional selective epitaxial growth step may then be applied to those of the FinFETs that are to be conventional FinFETs.

Figure 9:
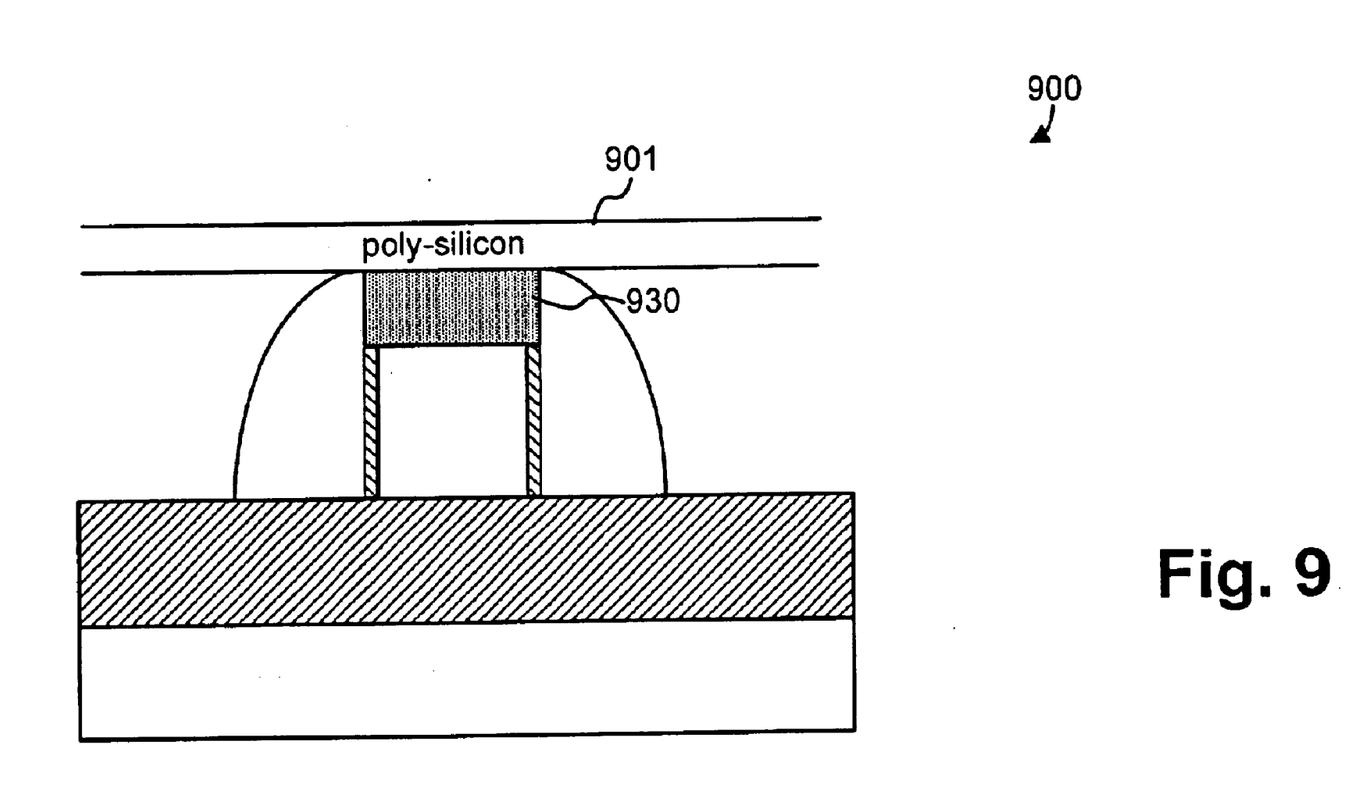
FIG. 9 is a diagram illustrating deposition of polysilicon over two gate portions of a FinFET.

FIG. 9 illustrates deposition of polysilicon over the two gate portions of a FinFET 900. Polysilicon layer 901 may be selectively formed on those of the FinFETs in the integrated circuit that are designed to have a single connected gate structure. Polysilicon layer 901 may be, for example, formed to a depth of 100 nm by selective epitaxial growth.

In other situations, it may be desirable to form a Schottky type source/drain formation for the FinFET. This can be accomplished using a damascene approach in which the nitride layer over the fin is used as an etch-stop. Referring to FIG. 9, polysilicon layer 901 may be used as an etch stop to etch a trench over nitride layer 930. After removing the silicon, a trench is left over the source/drain area. Metal can then be deposited and polished using nitride layer 930 as a stop layer. The metal forms Schottky contacts with the silicon channel.

Conclusion

A NOR gate is described above that can be implemented with two FinFET type transistors instead of the conventional four transistors. Thus, the NOR gate described herein uses half the conventional number of transistors, thereby providing significant improvements in gate density and in overall functionality of the integrated silicon device.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 100 nm and below, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A NOR gate comprising:
    a first FinFET including first and second independently controllable gate regions, a source region, and a drain region;
    a second FinFET including first and second independently controllable gate regions, a source region, and a drain region;
    a first input line of the NOR gate connected to the first gate region of the first FinFET and the first gate region of the second FinFET;
    a second input line of the NOR gate connected to the second gate region of the first FinFET and the second gate region of the second FinFET; and
    an output line of the NOR gate connected to the source of the first FinFET and the drain of the second FinFET.

2. The NOR gate of claim 1, wherein the first gate regions of the first and second FinFETs are doped with n-type impurities.

3. The NOR gate of claim 2, wherein the second gate regions of the first and second FinFETs are doped with p-type impurities.

4. The NOR gate of claim 1, wherein the first and second FinFETs are the only transistors included in the NOR gate.

5. An integrated semiconductor device comprising:
    a plurality of asymmetric FinFETs, at least some of the plurality of FinFETs being arranged as pairs of FinFETs that define logic NOR gates.

6. The integrated semiconductor device of claim 5, wherein the pairs of FinFETs include:
    a first FinFET including first and second independently controllable gate regions, a source region, and a drain region; and
    a second FinFET including first and second independently controllable gate regions, a source region, and a drain region;
    a first input line connected to the first gate region of the first FinFET and the first gate region of the second FinFET;
    a second input line connected to the second gate region of the first FinFET and the second gate region of the second FinFET; and
    an output line connected to the source of the first FinFET and the drain of the second FinFET.

7. The integrated semiconductor device of claim 6, wherein the first gate regions of the first and second FinFETs are doped with n-type impurities.

8. The integrated semiconductor device of claim 7, wherein the second gate regions of the first and second FinFETs are doped with p-type impurities.

9. A logic NOR circuit comprising:
    a first asymmetric double-gate transistor; and
    a second asymmetric double-gate transistor,
    wherein an output signal coupled to the first and second transistors reflects a logical NOR operation of two input signals applied to the first and second transistors.

10. The logic NOR circuit of claim 9, wherein the first and second asymmetric double-gate transistors are FinFETs.

11. The logic NOR circuit of claim 9, wherein the first and second asymmetric double-gate transistors each include:
    a first gate region;
    a second gate region configured to be controllable independently of the first gate region;
    a source region; and
    a drain region.

12. The logic NOR circuit of claim 11, wherein the first gate region is doped with n-type impurities.

13. The logic NOR circuit of claim 11, wherein the second gate region is doped with p-type impurities.

* * * * *